United States Patent [19]

Hildebrand et al.

[11] Patent Number: 4,571,689
[45] Date of Patent: Feb. 18, 1986

[54] MULTIPLE THERMOCOUPLE TESTING DEVICE

[75] Inventors: James R. Hildebrand, Palm Beach Gardens; Kurt J. Sobanski, North Palm Beach, both of Fla.

[73] Assignee: The United States of America as represented by the Secretary of the Air Force, Washington, D.C.

[21] Appl. No.: 435,515

[22] Filed: Oct. 20, 1982

[51] Int. Cl.⁴ ............................................ G01R 31/02
[52] U.S. Cl. .................................... 364/481; 324/51; 340/652; 364/550
[58] Field of Search ............. 324/51; 340/652; 361/162; 364/481, 482, 483, 550

[56] References Cited

U.S. PATENT DOCUMENTS

| | | | |
|---|---|---|---|
| 2,473,940 | 6/1949 | Clark | 340/515 |
| 3,030,575 | 4/1962 | Bockemuehl et al. | 324/51 |
| 3,468,164 | 9/1969 | Sutherland | 340/509 |
| 3,590,370 | 6/1971 | Fleischer | 324/51 |
| 3,760,265 | 9/1973 | Hutch | 324/51 |
| 3,829,849 | 8/1974 | Stauffer | 340/595 |
| 3,883,753 | 5/1975 | Harrison, Jr. et al. | 324/51 |
| 3,973,184 | 8/1976 | Raber | 324/51 |
| 4,121,460 | 10/1978 | Ekstrom | 374/180 |
| 4,130,019 | 12/1978 | Nitschko | 374/181 |
| 4,147,061 | 4/1979 | Wester et al. | 324/51 |
| 4,166,243 | 8/1979 | West et al. | 324/51 |
| 4,307,335 | 12/1981 | Paulson | 340/652 X |

Primary Examiner—Errol A. Krass
Assistant Examiner—Edward R. Cosimano
Attorney, Agent, or Firm—Donald J. Singer; Stanton E. Collier

[57] ABSTRACT

An automated multiple thermocouple testing device determines short and open circuits in a thermocouple system. The thermocouple system has a plurality of temperature probes, each probe has a first thermocouple and a second thermocouple. The device applies a direct current voltage to the first thermocouple to cause heating in the second thermocouple and then reads the temperature response of the second thermocouple. The first thermocouples have a common lead and the second thermocouples are connected in two parallel groups. The temperature output of the second thermocouple is digitized and read by a computer. These readings are compared to criteria which determines if there is an open circuit. Before the open circuit test is applied, the device also determines which thermocouple probe has a possible short circuit. This device can automatically test for short and open circuits in a thermocouple system within a few minutes without the necessity of removing the probes from their installed position. This device was adapted to preform the above testing on a F100 fan turbine inlet temperature (FTIT) system.

10 Claims, 10 Drawing Figures

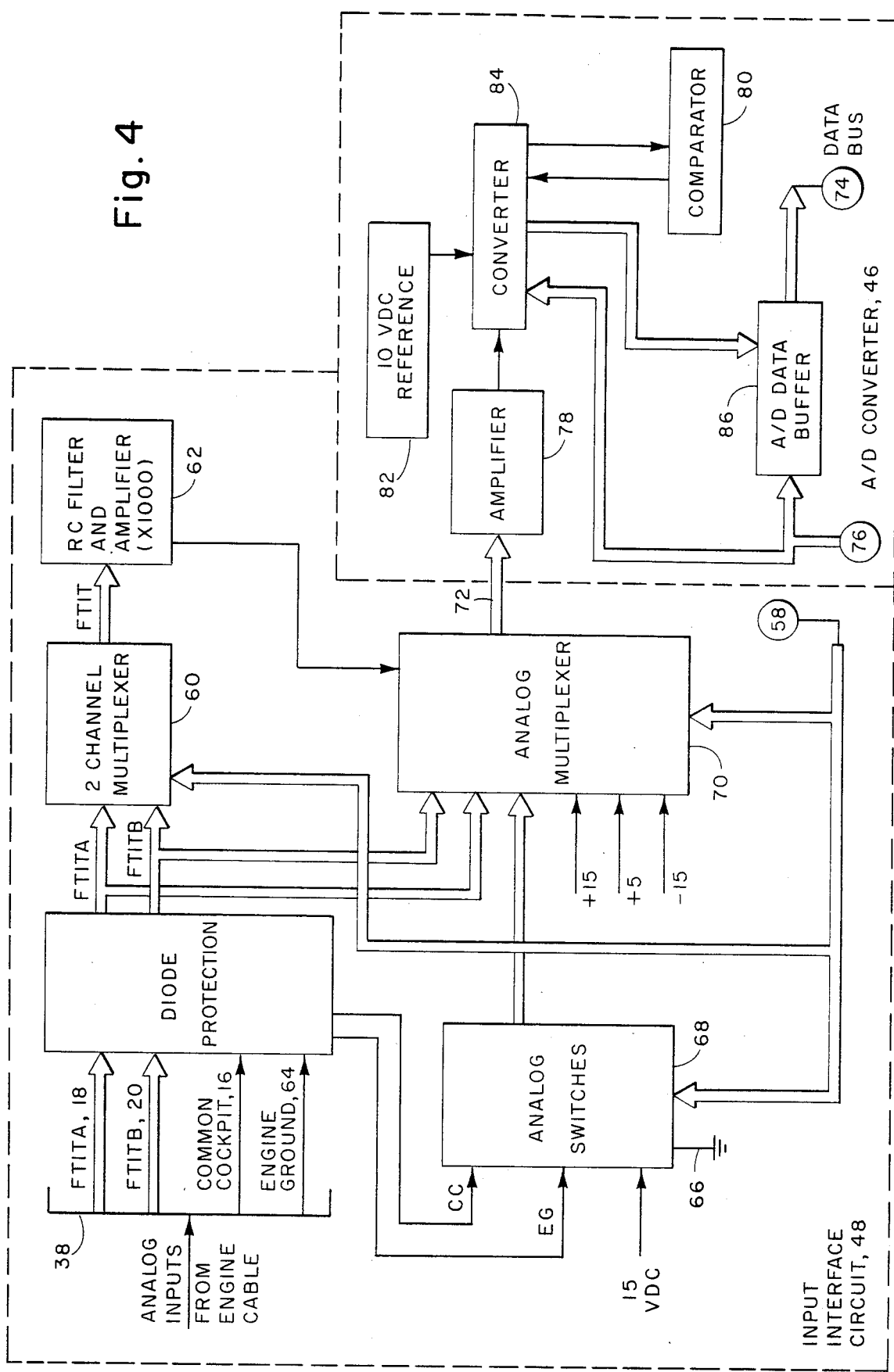

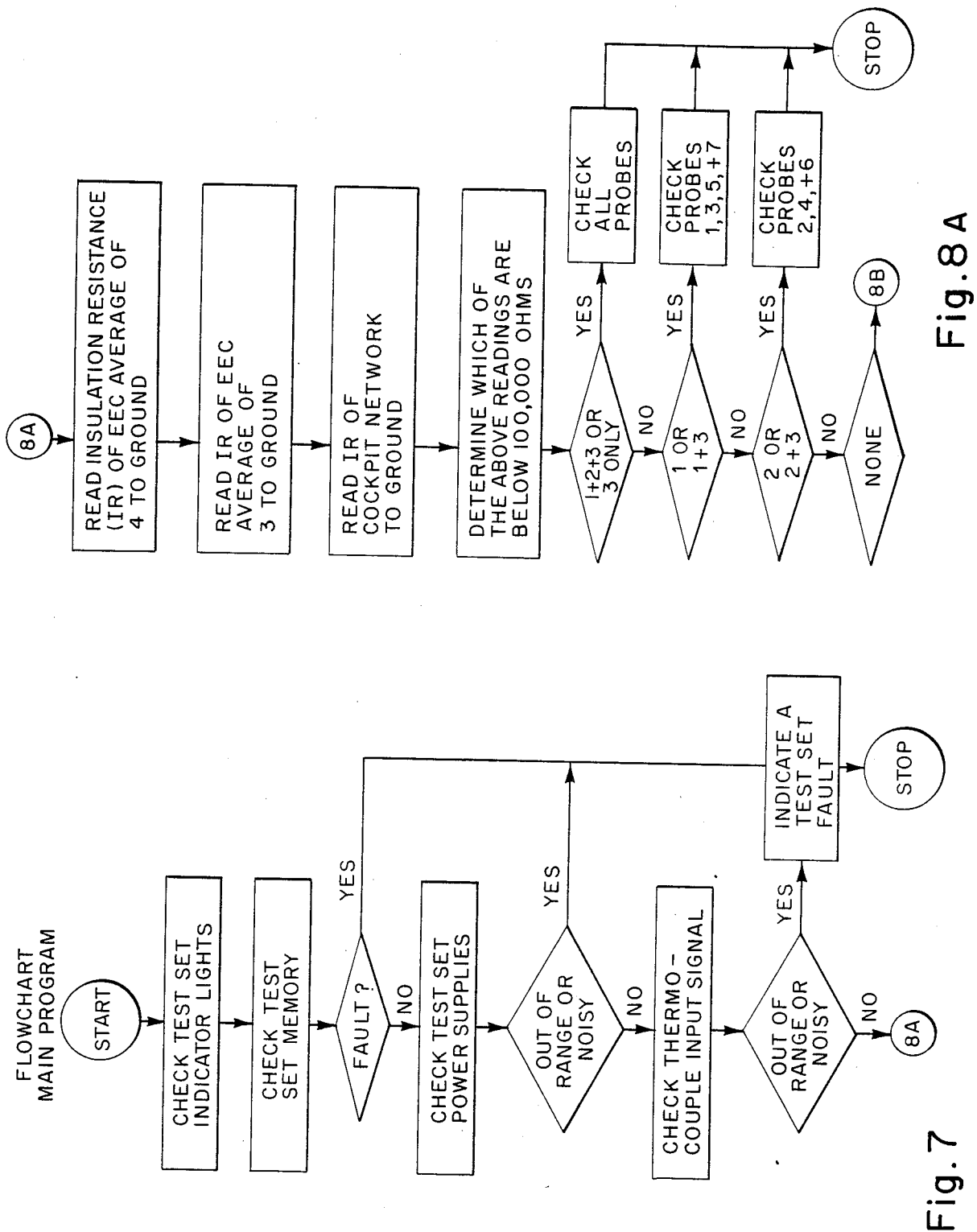

4,571,689

MULTIPLE THERMOCOUPLE TESTING DEVICE

STATEMENT OF GOVERNMENT INTEREST

The invention described herein may be manufactured and used by or for the Government for governmental purposes without the payment or any royalty thereon.

BACKGROUND OF THE INVENTION

This invention relates generally to a thermocouple testing device, and, more particularly, to an automated multiple thermocouple testing device that checks for short and open circuits. This device can be used to test thermocouple circuits in gas turbine engines.

In one possible application, multiple temperature probes are used to measure gas temperatures at various points throughout gas turbine engines such as in the combustion chamber and the inlet. Each probe may have a plurality of thermocouples therein for purposes such as redundancy in case of failure and the leads from these thermocouples may terminate in one location facilitating connection to a testing device that can indicate failure of one or more thermocouples, but in some cases, thermocouple leads may terminate at different locations making connection difficult or trouble shooting impossible. For example, the F100 fan turbine engine has two thermocouples in each probe in the fan turbine inlet temperature (FTIT) system. One thermocouple terminates in the cockpit area of the aircraft to indicate high temperature and the other thermocouple terminates in the engine electronic control area. Conventional trouble shooting procedures require that the engine is removed from the aircraft to be able to check the engine electronic control thermocouple circuits for short and open circuits. This procedure is clearly expensive and very time consuming. Thus there exists a need for a multiple thermocouple testing device that measures short and open circuits on a plurality of parallel connected thermocouples.

SUMMARY OF THE INVENTION

The present invention is directed to a computer controlled multiple thermocouple testing device that tests for short and open circuits of multiple probes having two thermocouples therein.

As noted above each probe has two thermocouples. One thermocouple is connected to the aircraft engine electronic control system and the other thermocouple is connected to the aircraft's cockpit display system. The device first tests for short circuits in the engine electronic control and the cockpit thermocouple circuits by checking the resistance to ground. If all the resistances are above 100,000 ohms, the device continues automatically to check for open circuits. If not, the short circuit must be corrected before the test continues. Thereafter the device applies sequentially a low voltage to each of the cockpit thermocouple circuits. This voltage produces a small current in the cockpit thermocouple which because of the resistance of the thermocouple produces heating in that selected probe. The heat is conducted through the selected probe to the engine electronic control thermocouple and causes a current to be produced which is measured. The increase in the output of the engine electronic control thermocouple circuit indicates to the computer multiple thermocouple testing device whether both cockpit and engine electronic control thermocouple circuits are continuous. No increase indicates that one or both of the circuits is open. The device is connected to two connectors and an external power source. A start button is pushed to initiate the sequence and the results are displayed by light indicators on the front panel of the testing device. A computer in the testing device sequences the voltages, reads digitized analog data from the thermocouples, determines and displays the results.

It is therefore one object of this invention to provide for an automated multiple thermocouple testing device;

Another object of this invention is to provide for a multiple thermocouple testing device that checks for short and open circuits of thermocouple circuits;

Another object of this invention is a multiple thermocouple testing device that is able to test a plurality of thermocouple probes wherein one group of thermocouples are connected individually and another group of thermocouples are connected in parallel groups; and Another object of this invention is a method of testing a plurality of thermocouple probes having multiple thermocouples in each probe.

These and many other objects and advantages of the present invention will be readily apparent to one skilled in the pertinent art from the following detailed description of a preferred embodiment of the invention and claims when considered in light of the drawings.

BRIEF DESCRIPTION OF THE DRAWINGS

FIG. 4 is an electronic block diagram of the input interface circuit and the analog-to-digital converter of FIG. 3 of this invention;

FIG. 7 is a flowchart of the monitor program stored in the computer of FIG. 2A of this invention; and FIGS. 8A and 8B are a flowchart of the main program stored in the computer of FIG. 2A of this invention.

DETAILED DESCRIPTION OF THE PREFERRED EMBODIMENT

In order to monitor the operating conditions of fan turbine engines, thermocouple probes are built into the engine at various points wherein temperature is of concern. For example, the F100 engine has seven thermocouple probes installed in the inlet area forming the fan turbine inlet temperature (FTIT) system. Each probe has two thermocouples, one is terminated in the cockpit area and the other thermocouple is terminated in the electronic engine control area. The cockpit thermocouples have a common lead and a separate lead to each one. The engine electronic control thermocouples have a group of 4 connected in parallel and a group of 3 connected in parallel. Without removing the engine so that each probe and thermocouple can be tested separately, a unique multiple thermocouple testing device automatically tests for short and open circuits using existing cables in the aircraft having the F100 engine. A programmed computer controls the testing as well as determines which probe is defective.

Figure 1:
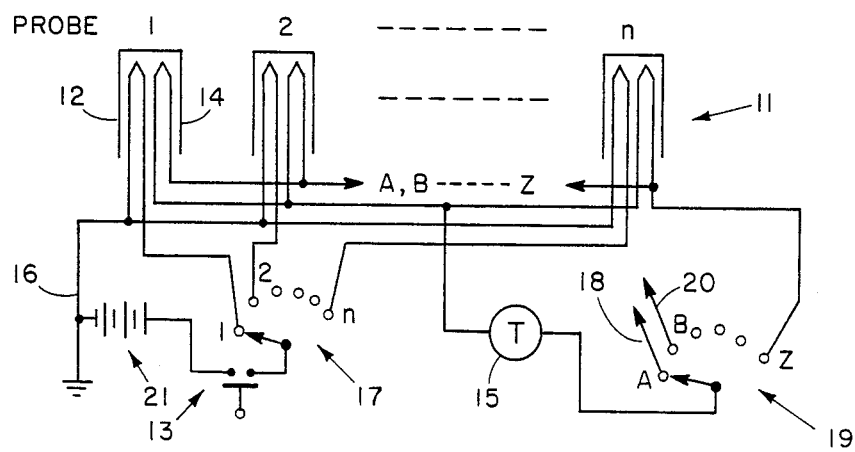
FIG. 1 is a partial schematic of the arrangement of the thermocouples of this invention and the basic means for testing continuity.

FIG. 1 by schematic diagram shows the configuration of probes 11 being n in number. In the F100 engine, for example, there are only seven probes. In each probe 11, there are two thermocouples, a cockpit thermocouple 12 and a electronic engine control thermocouple 14. For the testing device to function properly, thermocouples 12 and 14 in probe 11 must cause conductive heating of each other. It can be seen that a greater number of thermocouples in probe 11 would not deviate from the principles of the invention. Each cockpit thermocouple 12 is electrically independent except for a common lead 16. FIG. 1 shows engine electronic control thermocouples 14 connected in parallel groups. For example, in the F100 FTIT system there are two parallel groups of thermocouples 14. The first group of engine electronic control thermocouples 14, four in number and connected in parallel, is designated FTIT A 18 and the second group of three engine electronic control thermocouples 14 is designated FTIT B 20. Because thermocouples 14 are connected in parallel, particular probe 11 under test must be recorded if one or more of the thermocouples prove defective in that group.

Referring to FIG. 1, testing for continuity for the general case is illustrated. Probes one through n have thermocouples 14 connected in parallel groups A thru Z. A switch 17 is used to select which probe 11 is to have current applied therein. A switch 19 selects the proper group of probes, to include probe 11 having current therein. A start switch 13, applied for a short period of time, causes current to flow through common lead 16, battery 21, contact switch 13, switch 17, and selected thermocouple 12. This current causes heating of selected probe 11. Switch 19 having been set to the proper group having selected probe 11 therein allows current to flow through heated thermocouple 14, switch 19, and temperature indicating means 15. If both thermocouples 12 and 14 in selected probe 11 are continuous and otherwise proper, a temperature rise of a given amount indicates continuity of selected probe. Continuity is established in heated thermocouple 14 if there is a temperature increase greater than 4 degrees fahrenheit after the current flows through selected thermocouple 12 for about 20 seconds.

Figure 2A:
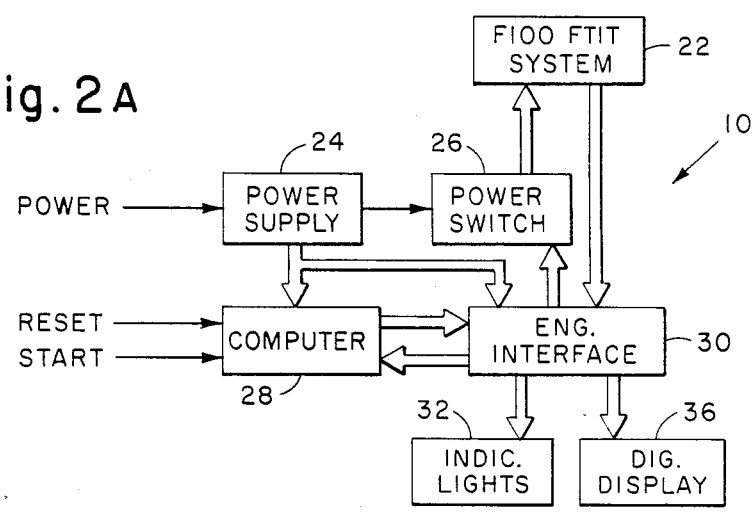
FIG. 2A is an electronic block diagram of the multiple thermocouple testing device of this invention.

A multiple thermocouple testing device 10 to accomplish the testing of thermocouples 14 is illustrated by electronic block diagram of FIG. 2A. Briefly, F100 FTIT system 22 contains thermocouples 14 as noted above. Electrical access to thermocouples 14 is obtained through connectors in the aircraft electrical system. A power supply 24 supplies appropriate direct current voltages such as +5, ±15, +18 volts to semiconductor devices. A power switching circuit 26 receives digital inputs from a power switching control circuit 54, shown in FIG. 3 as a part of engine interface circuit 30, that determine which cockpit thermocouple 12 receives the DC voltage from power supply 24 for purposes of heating. A computer 28 is programmed to perform the short and open circuit tests and present the data for display. An engine interface circuit 30 provides the necessary electronics to make analog-to-digital conversions, take thermocouple readings, make insulation resistance readings and display results. Engine interface circuit 30 is connected to accept data from computer 28, FTIT system 22, and to transmit data to computer 28, power switching circuit 26, and an indicator light display 32 and/or a digital display 36. Digital display 36 is not shown in any greater detail than as shown in FIG. 2A. Considering the data displayed on indicator light display 32, FIG. 2B, digitizing such is considered to be conventional and well within the ability of one skilled in the art.

Figure 2B:
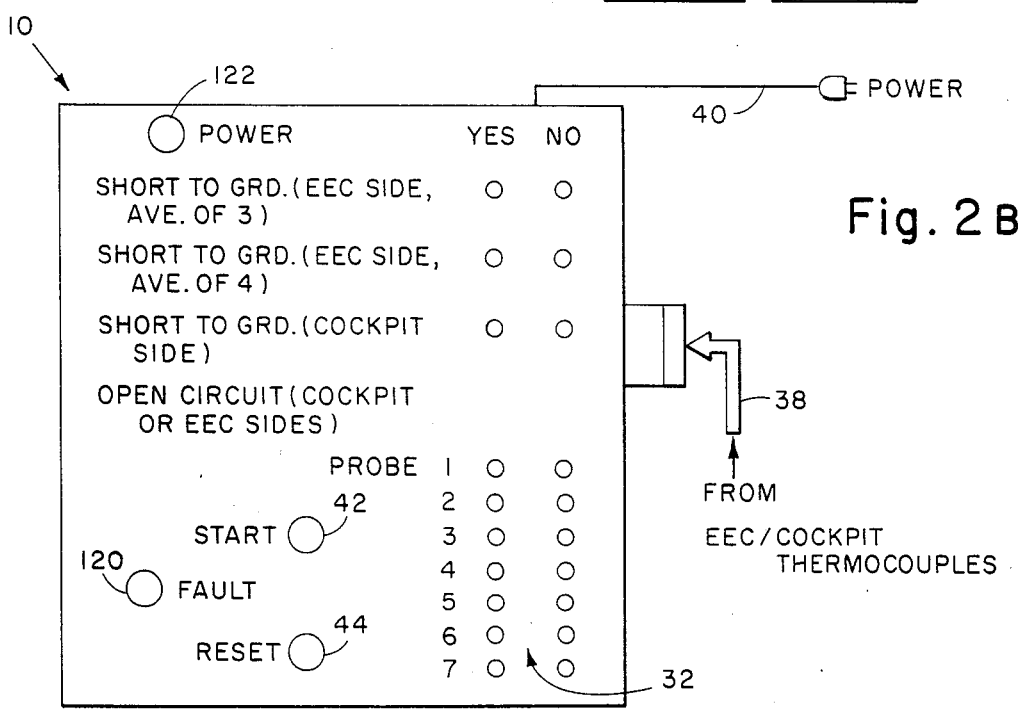
FIG. 2B is a front view schematic of the multiple thermocouple testing device of this invention.

A front view of device 10 is shown in FIG. 2B. External power 40 may be either 60 hertz, 115 VAC or 400 hertz, 115 VAC. Aircraft engine electronic control cable 38 is connected to device 10 wherein designated pins are connected to FTIT system 22. A start switch 42 initiates the test sequence and if no problems occur indicator lights 32 turn-on in the righthand column. If a problem occurs in the short-to-ground test, the problem must be corrected before the testing is restarted. A reset switch 44 re-initiates the testing sequence. If no short-to-ground problems occur, the test continues to check for open circuits in probes 11.

Figure 3:
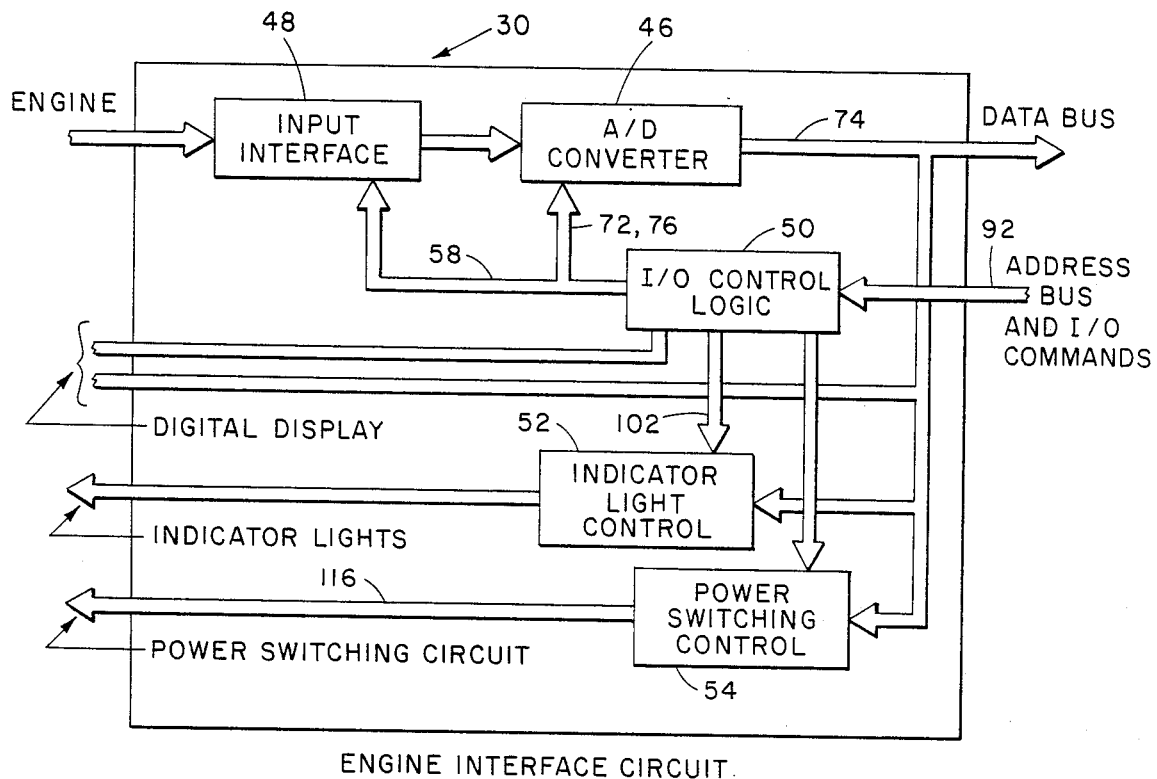
FIG. 3 is an electronic block diagram of engine interface circuit of FIG. 2A of this invention.

Engine interface circuit 30 of FIG. 2A is expanded in FIG. 3 which defines further electronic block diagram functions performed within device 10. The main functions of engine interface circuit 30 are: (1) accepting analog inputs from engine electronic control cable 38 and multiplexing these inputs to an analog-to-digital converter 46; (2) providing all inputs from computer 28 and all outputs to computer 28; (3) converting the analog signals to digital and supplying the digital signals to computer 28; and (4) controlling power switching circuit 26 during application of power to cockpit thermocouple circuits 12.

Figure 5:
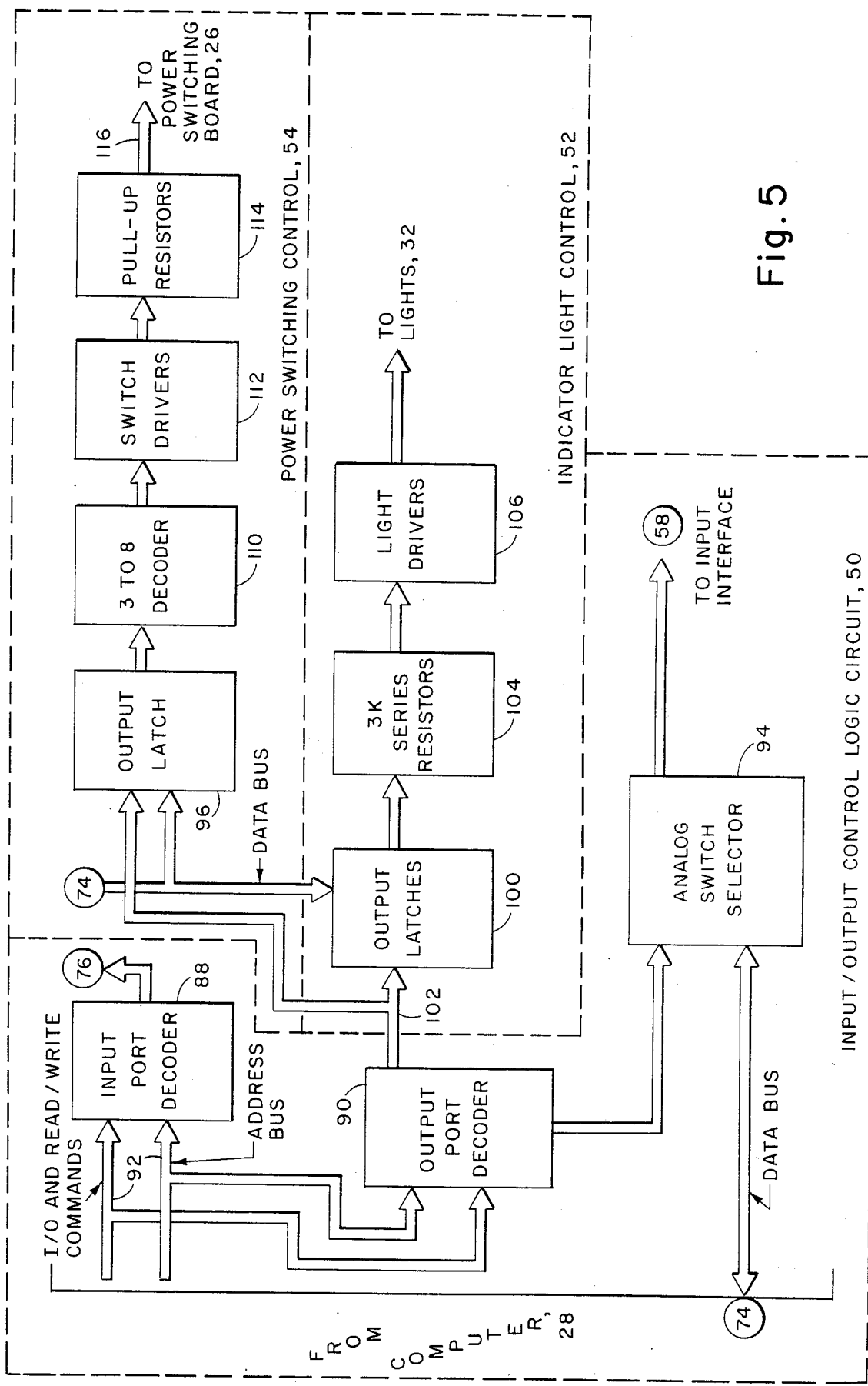
FIG. 5 is an electronic block diagram of the input/output control logic circuit, the indicator light control circuit and the power switching control circuit of FIG. 3 of this invention.

One function of engine interface circuit 30 is performed by an input interface circuit 48 shown in FIG. 3 and further detailed in FIG. 4. FIG. 5 when placed under FIG. 4 and combined therewith is a more detailed breakdown of FIG. 3. Referring to FIG. 4, input interface circuit 48 receives analog signals from FTIT A 18 and FTIT B 20 on connection 38 and multiplexes these signals to analog-to-digital converter 46. Engine electronic control thermocouples 14 selected by digital inputs from input/output control logic circuit 50 are switched to an instrumentation amplifier 62 through a multiplexer 60. The insulation resistance measurements are taken by connecting an engine ground 64 to a power supply ground 66 through an analog switch 68 and applying 15 VDC through analog switch 68 to the particular cockpit or engine electronic control thermocouple 12 or 14, respectively, under test for a short circuit. Insulation measurements of FTIT A 18, FTIT B 20 or cockpit thermocouples 12 are switched by analog switch 68 and an analog multiplexer 70 by digital signals over connection 58 to A/D converter circuit 46. Input interface circuit 48, FIG. 4, also provides ±15 VDC and 5 VDC to analog-to-digital converter 46 through analog multiplexer 70 as a self-test. These results are checked by computer 28 for proper levels.

Analog-to-digital converter 46, FIG. 4, receives an analog signal from input interface circuit 48 on a connection 72 and provides computer 28 with a binary equivalent of the analog signal via data bus 74. The conversion begins with receipt of a start conversion pulse from input/output control logic circuit 50, FIG. 5, via a connection 76 to a converter 84. The conversion process requires an amplifier 78, a comparator 80, and a voltage reference 82 connected to converter 84. A ten bit binary word is sent to computer 28 via data bus 74 through an analog-to-digital data buffer 86.

Input/output control logic circuit 50, shown in FIG. 3 and further detailed in FIG. 5, provides the necessary signals to facilitate input and output to and from computer 28 on data bus 74. An input port decoder 88 and an output port decoder 90 receive address and read/write signals from computer 28 via connection 92. These signals are used to determine which device computer 28 is sending or receiving information from. Upon receipt of a pulse from a given decoder, the input/output devices either transmit or receive data. Input/output control logic circuit 50 also selects thermocouples and insulation resistance points by sending signals to input interface circuit 48, FIG. 4, through an analog switch selector 94 to multiplexer 60, analog switches 68, and analog multiplexer 70. Latching occurs upon computer command and remains latched until released. Analog switch selector 94 determines which signal is supplied to analog-to-digital converter 46 through input interface circuit 48.

Indicator light control circuit 52, FIG. 5, drives indicating lights 32 with information from computer 28 sent on data bus 74. Information displayed by lights 32 is latched by output latches 100 upon receipt of a pulse from input/output control logic circuit 50 on connection 102. Latch information is sent through resistors 104 and light drivers 106.

Figure 6:
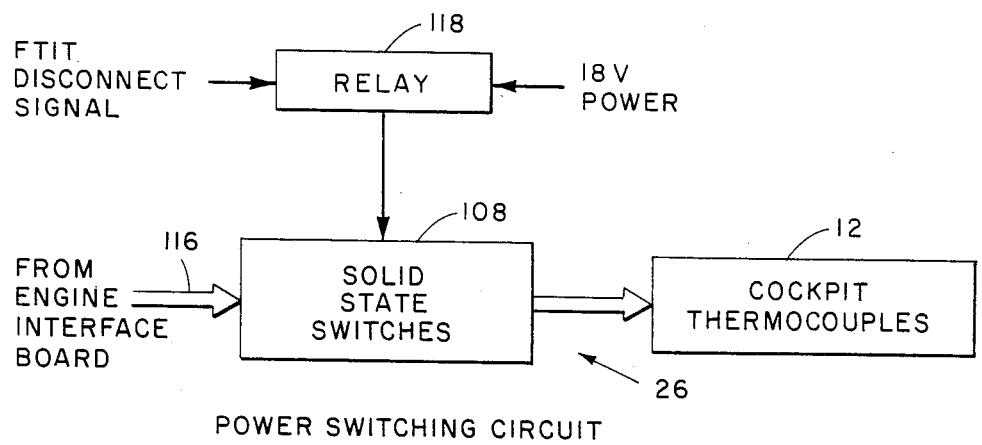
FIG. 6 is an electronic block diagram of the power switching circuit of FIG. 2A of this invention.

Power switching control circuit 54, shown in FIG. 3 and detailed in FIG. 5, controls solid state switches 108, shown in FIG. 6, that apply current to selected cockpit thermocouples 12. Computer 28 causes current to flow through selected probe 11 by sending a pulse to power switching control circuit 54 from decoder 90. When power switching control circuit 54 receives the pulse, information on data bus 74 of input/output control logic circuit 50 is latched to output latch 96. The output of latch 96 is decoded by a decoder 110 and sent to power switching circuit 26, FIG. 6, through drivers 112 and pull-up resistors 114.

Power switching circuit 26, shown in FIG. 6, directs current through cockpit thermocouples 12 under test based upon input pulses received over connection 116 from power switching control circuit 54 of engine interface circuit 30. These inputs turn on and off a plurality of solid state switches 108 such as conventional transistors. Switches 108 are turned on one at a time to drive current through cockpit thermocouples 12. A relay 118 causes the application of 18 VDC supply to switches 108 only when device 10 is connected to FTIT system 22.

The various components and circuit elements described above are common off-the-shelf items. Table I below identifies specific elements that are suitable for use in making this device.

PARTS TABLE

| REF. NO. | NAME | DEVICE TYPE | QUANTITY |
|---|---|---|---|
| 28 | Computer | Intel SBC 80/05 | 1 |
| 34 | Input SwPort | SPDT Switches | 4 |
| 60 | 2-Channel Multiplexer | AD7510 | 1 |
| 62 | Amplifier | AD522 | 1 |
| 68 | Analog Switches | AD7510 | 1 |
| 70 | Analog Multiplexer | AD7506 | 1 |
| 78 | Amplifier | AD506 | 1 |
| 80 | Comparator | LM311 | 1 |
| 82 | Voltage Ref | AD581 | 1 |
| 84 | Converter | AD7570 J | 1 |
| 88 | Input Port Decoder | 74LS138 | 1 |
| 90 | Output Port Decoder | 74LS138 | 1 |

-continued

PARTS TABLE

| REF. NO. | NAME | DEVICE TYPE | QUANTITY |
|---|---|---|---|
| 94 | Analog Sw Selector | 8212 | 1 |
| 96 | Output Latch | 8212 | 1 |
| 100 | Output Latches | 8212 | 3 |
| 104 | Series Resistors | 3K | 3 |
| 106 | Light Drivers | MHQ2222 | 6 |
| 108 | Solid State Switches | Transistors | 7 |
| 110 | Decoder | 74LS138 | 1 |
| 112 | Switch Drivers | SN 7404 | 5 |

Figure 8B:
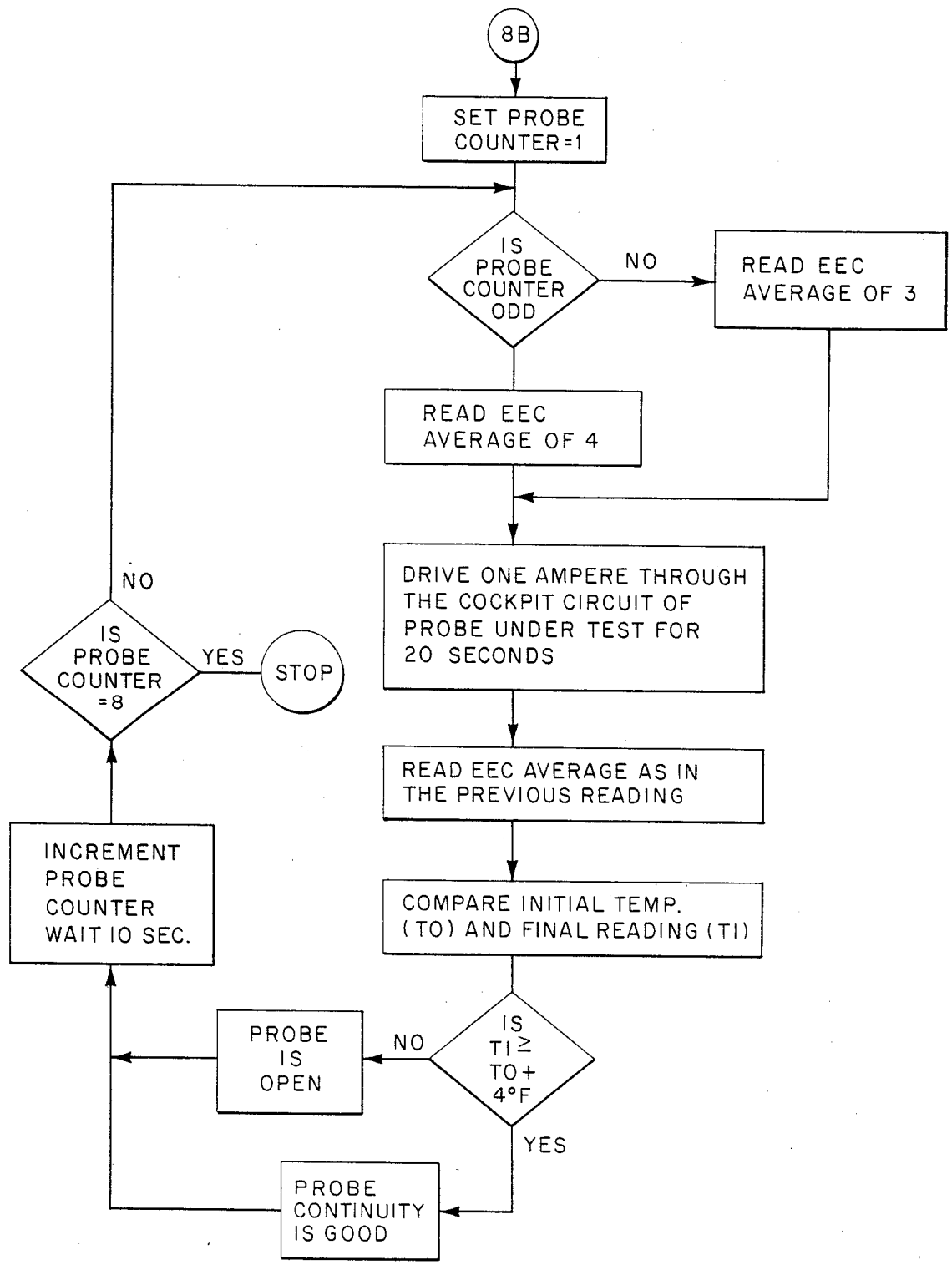

Computer 28 performs data storage, computations, and controls the testing. An Intel SBC 80/05 Single Board Computer is used to implement the required functions and the software for device 10 includes a monitor program, main program, and several subroutines. The flowcharts of the monitor and main program are shown in FIG. 7, and FIGS. 8A and 8B. The monitor program is written to provide diagnostic test, examine registers and memory locations, and run short test programs in the random access memory (RAM). The main program performs the necessary function to test FTIT system 22 for short circuits and open circuits.

In operation, multiple thermocouple testing device 10 is connected to external power, FIG. 2B. The engine electronic control cable 38 is then connected to device 10. Power button 122 is switched on, reset button 44 pushed, and start button 42 pushed. Indicator lights 32 are all turned-on for a 5 second period to check functioning. A self-test, as shown in FIG. 7, is performed by computer 28. An error is indicated by a fault light 120 on device 10. The insulation resistance test is performed on FTIT system 22 next. If any short-to-ground indicator lights (under yes) are illuminated, the connector for that probe must be disconnected and a resistance reading taken from each of the pins to ground. If less than 750K ohms, for example, the probe must be replaced. If no shorted probes are found, engine electronic control cable 38 must be checked. After all the short circuits are removed and the cables connected, the reset button is pushed. If any of indicator lights 32 (under yes) are illuminated after the open circuit test, engine electronic control cable 38 is removed and probe 11 having the open circuit is located. If probe 11 does not have the open circuit, the cables are checked for open circuits also. A test result with all lights illuminated (under no) indicate an FTIT system 22 with no short or open circuits.

Clearly, many modifications and variations of the present invention are possible in light of the above teachings and it is therefore understood that, within the scope of the inventive concept, the invention may be practiced otherwise than specifically described.

We claim:
1. A multiple thermocouple testing device for determining electrical short and open circuits in a thermocouple system, said thermocouple system having a plurality of probes, each of said probes having a first thermocouple and a second thermocouple, said second thermocouples of said probes are connected in a plurality of parallel groups, said multiple thermocouple testing device comprising
   a computer programmed to: read test values, compare test values to defined constants, direct current to a selected first thermocouple, output results of the comparison, check test values for noise, and control functioning of said multiple thermocouple testing device, said computer starting upon a given command, and returning to start upon being reset;

means for providing direct current voltages to said computer;

means for selectively applying a direct current voltage to said selected first thermocouple of said thermocouple system, said direct current voltage being input to said means for selectively applying by said means for providing direct current voltages;

means for interfacing, said means for interfacing receiving a plurality of direct current voltages from said means for providing direct current voltages for powering said means for interfacing, said means for interfacing connected to said computer for inputting data thereto and receiving data therefrom, said means for interfacing outputting control signals to said means for selectively applying a direct current voltage to said thermocouple system, and said means for interfacing connected to receive analog signals from said thermocouple system and digitizing said signals; and means for displaying said output results, said means for displaying connected to said means for interfacing.

2. A multiple thermocouple testing device as defined in claim 1 wherein said means for interfacing includes an engine interface circuit comprising:

an input interface connected to said thermocouple system;

an analog-to-digital converter connected to receive analog signals from said input interface and connected to a data bus;

an input/output control logic circuit connected to receive signals from said computer, and connected to transmit signals to said analog-to-digital converter and said input interface circuit;

an indicator light control circuit connected to receive signals from said input/output control logic circuit and said data bus, and connected to transmit signals to indicator lights; and a power switching control circuit connected to receive signals from said input/output control logic circuit and said data bus, and connected to transmit signals to said means for selectively applying a direct current voltage to said thermocouple system.

3. A multiple thermocouple testing device as defined in claim 2 wherein said input interface circuit includes means for protecting said thermocouple system, said means for protecting connected to receive output signals from said thermocouple system; a multiplexer connected to receive output signals from said means for protecting; an amplifier connected to output signals from said multiplexer; analog switches connected to receive output signals from said means for protecting and connected to receive output signals from said input/output control logic circuit; and an analog multiplexer connected to receive output signals from said means for protecting, said amplifier, said analog switches, said input/output control logic circuit and connected to output signals to said analog-to-digital converter.

4. A multiple thermocouple testing device as defined in claim 2 wherein said analog-to-digital converter includes a amplifier connected to receive output signals from said input interface circuit, a converter connected to receive output signals from said amplifier and said input/output control logic circuit and to said data bus; a voltage reference connected to input a voltage to said converter; a comparator connected to said converter; and an analog-to-digital data buffer connected to output signals to said input/output control logic circuit, receive output signals from said converter, and to output signals to said data bus.

5. A multiple thermocouple testing device as defined in claim 2 wherein said input/output control logic circuit includes an input port decoder and output port decoder connected to receive output signals from said computer, said output port decoder connected to output signals to said indicator light control circuit and to said power switching control circuit; and an analog switch selector connected to receive signals on said data bus, to receive outputs from said output port decoder, and connected to output signals to said input interface circuit.

6. A multiple thermocouple testing device as defined in claim 2 wherein said indicator light control circuit includes output latches connected to receive output signals from said input/output control logic circuit and from said data bus; series resistors connected to receive output signals from said output latches; light drivers connected to receive output signals from said series resistors and to output signals to said indicator lights.

7. A multiple thermocouple testing device as defined in claim 2 wherein said power switching control circuit includes output latches connected to receive output signals from said data bus and said input/output control logic circuit, a decoder connected to receive output signals from said output latches, switch drivers connected to receive output signals from said decoder, pull-up resistors connected to receive output signals from said switch drivers and to output signals to said means for selectively applying a direct current voltage to a selected first thermocouple.

8. A continuity checking circuit for a thermocouple system, said thermocouple system having a plurality of thermocouple probes, each thermocouple probe having a first and second electrically isolated thermocouple, said second thermocouples are connected in parallel groups, said continuity checking circuit comprising, means for sequentially applying current to said first thermcouples;

means for sequentially measuring a temperature increase in said second thermocouples after the application of current to said first thermocouples; and means for displaying continuity of said probes based upon the temperature increase of said second thermocouple after the current application to said first thermocouple.

9. A method of determining electrical continuity of a plurality of thermocouple probes, each of said probes having a first thermocouple and a second thermocouple, said second thermocouples are connected in parallel groups, said method comprising the steps of:

applying sequentially current to said first thermocouples;

allowing sufficient time for said second thermocouple, located in said probe with said first thermocouple that sequentially received current, to heat;

measuring the output of said group having said heated second thermocouple therein; and determining the continuity of said probes.

10. A method of determining electrical continuity as defined in claim 9, wherein said step of determining the continuity of said probe exists if said heated second thermocouple has a temperature increase greater than 4 degree fahrenheit after the current flows through said first thermocouple for about 20 seconds.

* * * * *